United States Patent [19]
Iwata

[11] Patent Number: 6,049,252
[45] Date of Patent: Apr. 11, 2000

[54] PROGRAMMABLE-GAIN AMPLIFIER

[75] Inventor: Hiromitsu Iwata, Tokyo, Japan

[73] Assignee: NEC Corporation, Japan

[21] Appl. No.: 09/106,232

[22] Filed: Jun. 29, 1998

[30] Foreign Application Priority Data

Jun. 30, 1997 [JP] Japan ................................. 9-187162

[51] Int. Cl.$^7$ .................................................. H03F 3/45
[52] U.S. Cl. ................................... 330/254; 330/133
[58] Field of Search ................................ 330/254, 133, 330/257

[56] References Cited

U.S. PATENT DOCUMENTS

| | | | |
|---|---|---|---|
| 4,213,097 | 7/1980 | Chiu et al. | 330/51 |
| 4,514,702 | 4/1985 | Zogg | 330/254 |
| 4,623,933 | 11/1986 | Sato et al. | 358/228 |
| 5,216,384 | 6/1993 | Vanhecke | 330/279 |
| 5,831,477 | 11/1998 | Tsumura | 330/51 |
| 5,872,475 | 2/1999 | Otaka | 327/308 |

FOREIGN PATENT DOCUMENTS

| | | | |
|---|---|---|---|
| 0316607 | 5/1989 | European Pat. Off. | 330/254 |
| 8-139531 | 5/1931 | Japan . | |
| 55-68713 | 5/1980 | Japan | 330/254 |
| 61-48208 | 3/1986 | Japan | 330/254 |
| 62-233908 | 10/1987 | Japan | 330/254 |
| 2117584 | 10/1983 | United Kingdom | 330/254 |

*Primary Examiner*—Benny Lee
*Assistant Examiner*—Henry Choe
*Attorney, Agent, or Firm*—Ostrolenk, Faber, Gerb & Soffen, LLP

[57] ABSTRACT

To provide a programmable-gain amplifier in which sufficiently fine and linear gain control according to the logic levels of control signals can be realized with a simple circuit configuration, a programmable-gain amplifier includes a cascade connection of differential amplifiers ($E_1$ to $E_n$) and a current controller (100) for controlling a product of corresponding emitter currents supplied to each of the differential amplifiers ($E_1$ to $E_n$) according to the logic levels of binary control signals. The current controller (100) has a current mirror circuit in which the emitter of each bi-polar transistor ($Q_0$ to $Q_n$, $Q_{c1}$ to $Q_{cm}$) is connected to the ground through a MOS ($M_0$ to $M_n$, $M_{c1}$ to $M_{cm}$) transistor having a relative on-resistance designed to be in inverse proportion to the relative emitter size of the bi-polar transistor, so that the emitter current can be exactly controlled.

3 Claims, 6 Drawing Sheets

FIG.4

| | CLT1 | CLT2 | CLT3 | CLT4 | CLT5 | CLT6 | RELATIVE GAIN(dB) | LINEARITY DEVIATION | AMPLIFICATION FACTOR |
|---|---|---|---|---|---|---|---|---|---|
| 0 | Low | Low | Low | Low | Low | Low | 0.00 | - | 23.17 |
| 1 | High | Low | Low | Low | Low | Low | 0.42 | 1.048 | 24.27 |
| 2 | Low | High | Low | Low | Low | Low | 0.83 | 1.045 | 25.40 |
| 3 | High | High | Low | Low | Low | Low | 1.22 | 1.044 | 26.61 |
| 4 | Low | Low | High | Low | Low | Low | 1.59 | 1.050 | 27.86 |
| 5 | High | Low | High | Low | Low | Low | 2.01 | 1.048 | 29.17 |
| 6 | Low | High | High | Low | Low | Low | 2.42 | 1.045 | 30.55 |
| 7 | High | High | High | Low | Low | Low | 2.80 | 0.941 | 31.99 |
| 8 | Low | Low | Low | High | Low | Low | 2.28 | 1.050 | 32.36 |
| 9 | High | Low | Low | High | Low | Low | 2.70 | 1.048 | 31.62 |
| 10 | Low | High | Low | High | Low | Low | 3.11 | 1.045 | 33.11 |
| 60 | Low | Low | High | High | High | High | 22.37 | 1.044 | 305.49 |
| 61 | High | Low | High | High | High | High | 22.80 | 1.050 | 319.99 |
| 62 | Low | High | High | High | High | High | 23.20 | 1.048 | 335.00 |
| 63 | High | High | High | High | High | High | 23.59 | 1.045 | 350.75 |

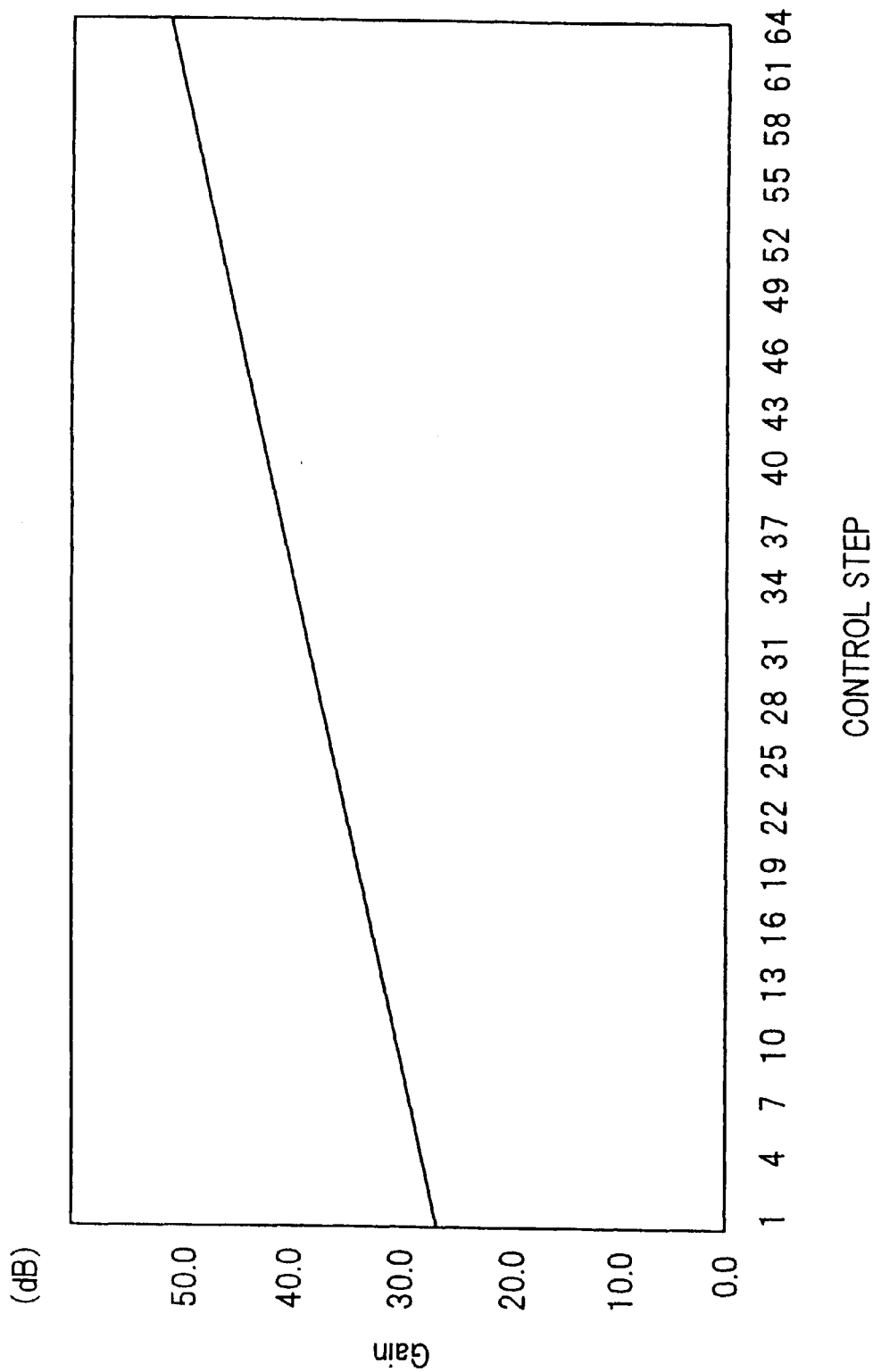

PROGRAMMABLE-GAIN AMPLIFIER

BACKGROUND OF THE INVENTION

The present invention relates to a programmable-gain amplifier making use of switching characteristics of MOS (Metal Oxide Semiconductor) transistors and transfer characteristics of bi-polar transistors.

FIG. 6 is a circuit diagram illustrating a conventional example of the programmable-gain amplifier making use of switching characteristics of MOS transistors and transfer characteristics of bi-polar transistors, which have a cascade connection of a first to an n-th (n being an integer more than one) differential amplifier $E_1$ to $E_n$, each having a circuit configuration disclosed in Japanese patent application laid open as Provisional Publication No. 139531/'96.

Referring to FIG. 6, each of the differential amplifier, the first differential amplifier $E_1$, for example, comprises a pair of differential bi-polar transistors $Q_1$ and $Q_2$ having emitters commonly connected to a constant current supply $I_1$, a pair of first resistors $R_{11}$, a pair of second resistors $R_{12}$, and a pair of MOS transistors $M_1$ and $M_2$. Each of the first resistors $R_{11}$ and each of the second resistors $R_{12}$ are serially connected between a power supply Vcc and a collector of each of the differential bi-polar transistors $Q_1$ and $Q_2$. Each of the MOS transistors $M_1$ and $M_2$ is connected to each of the first resistors $R_{11}$ in parallel and gates of the MOS transistors $M_1$ and $M_2$ are commonly controlled by a first control signal $CTL_1$.

When the MOS transistors $M_1$ and $M_2$ are controlled to be OFF, the amplification factor $A_1$ of the first differential amplifier $E_1$ is represented by $$A_1 = q \times I_1 \times (R_{11}+R_{12})/2kT, \quad (1)$$

and is represented by $$A_1 = q \times I_1 \times (R_{11}+R_0)/2kT \quad (2)$$

when the MOS transistors $M_1$ and $M_2$ are controlled to be ON, where q, k, T, $I_1$, $R_{11}$, $R_{12}$ and $R_0$ represent the charge of an electron, the Boltzman constant, an absolute temperature, a current value of the constant current supply $I_1$ and resistance values of the first resistor $R_{11}$, the second resistor $R_{12}$ and the parallel connection of the first resistor $R_{11}$ and on-resistance of the MOS transistor $M_1$ or $M_2$, respectively.

Hence, by controlling ON/OFF of the MOS transistors $M_1$ and $M_2$ by the first control signal $CTL_1$, the gain, or the amplification factor $A_1$, of the first differential amplifier $E_1$ can be changed. In the same way, each of the gains of the second to the n-th differential amplifiers $E_2$ to $E_n$ can be controlled by changing the logic level of each of a corresponding one of a second to n-th control signal $CTL_2$ to $CTL_n$.

Thus, the total gain A of the conventional programmable-gain amplifier of FIG. 6, which is given by a product of each of the amplification factors of the first to the n-th differential amplifiers $E_1$ to $E_n$, can be controlled with multi-steps according to the logic levels of the first to n-th control signals $CTL_1$ to $CTL_n$.

However, as can be understood from the above equation (2), the amplification factor of each differential amplifier $E_1$ to $E_n$ is a function of the absolute value of the on-resistance of the MOS transistor in the conventional programmable gain amplifier of FIG. 1. Furthermore, the on-resistance of the MOS transistor is easily affected by variation of its diffusion process and depends on operating temperature.

Therefore, it has been very difficult to obtain a multi-step programmable-gain amplifier in which the gain can be controlled with sufficiently fine and linear steps in dB (decibels), that is, exponentially.

SUMMARY OF THE INVENTION

Therefore, a primary object of the present invention is to provide a programmable-gain amplifier with a simple circuit configuration, wherein gain control with sufficiently fine and linear steps is enabled according to the logic levels of binary signals.

In order to achieve the above object, a programmable-gain amplifier of the invention comprises:

a cascade connection of a plurality of differential amplifiers, each having a pair of bi-polar transistors having emitters which are commonly connected; and a current controller having output terminals for outputting emitter current to the commonly connected emitter of the pair of bi-polar transistors of each of the differential amplifiers, a product of the emitter currents being controlled according to the logic levels of a set of binary control signals supplied to the current controller.

Therefore, by arranging certain ones of the emitter currents to be multiplied by a different ratio according to the logic levels of each of the binary control signals, the gain of the programmable-gain amplifier can be controlled with sufficiently fine steps and within a wide range.

For example, by arranging one of the emitter currents to be approximately multiplied by a $2^{i-1}$-th member of a geometric series, when an i-th binary control signal is turned to HIGH, the gain can be controlled with quasi-linear steps measured in dB, wherein i is a positive integer.

For realizing such a programmable-gain amplifier controllable with sufficiently exact linearity, for example, the current controller having a current mirror circuit comprises:

an input bi-polar transistor in which an emitter is connected to a ground through an input MOS transistor controlled to be ON, wherein a constant current is flowing through the input bi-polar transistor;

output bi-polar transistors, each of the output bi-polar transistors having a collector connected to each of the output terminals of the current controller, a base connected to a base of the input bi-polar transistor, and an emitter connected to the ground through a MOS transistor controlled to be ON, wherein a relative on-resistance of said MOS transistor to the input MOS transistor is designed to be in inverse proportion to a relative emitter size of said each of the output bi-polar transistors to the input bi-polar transistor; and control bi-polar transistors, each of the control bi-polar transistors having a collector connected to one of the output terminals of the current controller, a base connected to a base of the input bi-polar transistor, and an emitter connected to the ground through a MOS transistor, wherein a relative on-resistance of said MOS transistor to the input MOS transistor is designed to be in inverse proportion to a relative emitter size of said each of the control bi-polar transistors to the input bi-polar transistor, and wherein said MOS transistor is switched according to a logic level of one of the binary control signals.

Therefore, each of the emitter currents can be designed to be controlled precisely, since the relative on-resistance of the MOS transistors is little affected by their fabrication process, even if the on-resistance itself, i.e., the absolute value, may be affected.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or corresponding parts.

FIG. 4 is a table chart illustrating a portion of the relative gains obtained according to the logic levels of the control signals from a programmable-gain amplifier fabricated according to the circuit of FIG. 3.

FIG. 5 is a graphical chart representing a linear increase of the gain obtained from the example of FIG. 3 according to control steps.

DETAILED DESCRIPTION OF THE PREFERRED EMBODIMENTS

Now, embodiments of the present invention will be described in connection with the drawings.

Figure 1:
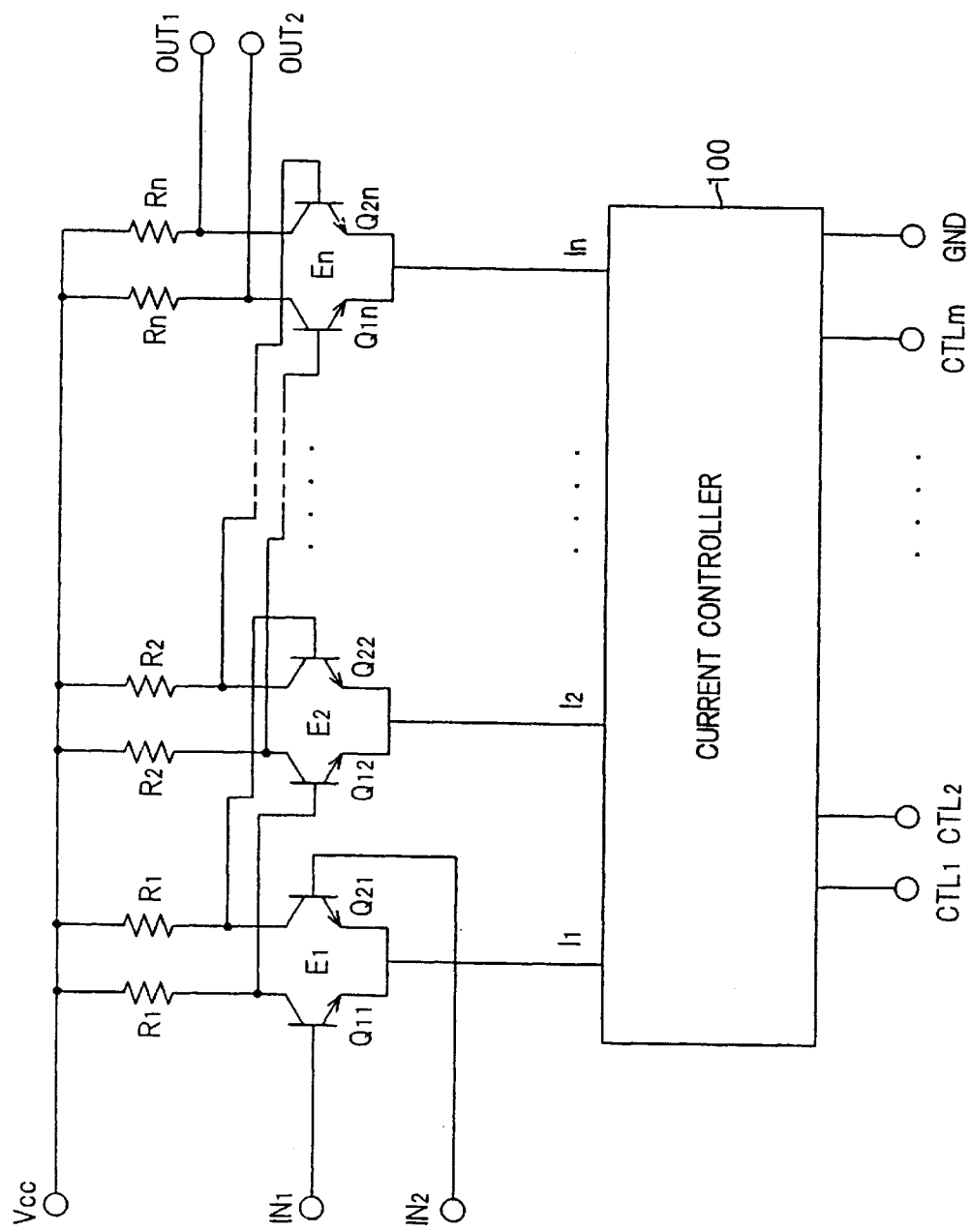
FIG. 1 is a block diagram illustrating a programmable-gain amplifier according to an embodiment of the invention.

FIG. 1 is a block diagram illustrating a programmable-gain amplifier according to an embodiment of the invention, comprising a cascade connection of a first to an n-th differential amplifier $E_1$ to $E_n$ and a current controller 100 for supplying each of a first to an n-th emitter current $I_1$ to $I_n$ to respective ones of the first to the n-th differential amplifiers $E_1$ to $E_n$.

Each of the first to the n-th differential amplifiers $E_1$ to $E_n$, the i-th differential amplifier $E_i$ (i=1, . . . , n), comprises a pair of differential bi-polar transistors $Q_{1i}$ and $Q_{2i}$ having emitters commonly connected to a respective output terminal of the current controller 100, and a pair of resistors $R_i$ having the same resistance each connecting respective collectors of the bi-polar transistors $Q_{1i}$ and $Q_{2i}$ to a power supply Vcc.

Bases of the pair of bi-polar transistors $Q_{11}$ and $Q_{21}$ are connected to complementary input terminals $IN_1$ and $IN_2$. Bases of the pair of bi-polar transistors $Q_{1i}$ and $Q_{2i}$ of each i-th differential amplifier $E_i$ (i=2, . . . , n) are connected to corresponding collectors of the pair of bi-polar transistors $Q_{1(i-1)}$ and $Q_{2(i-1)}$ of a preceding differential amplifier $E_{i-1}$. Collectors of the pair of bi-polar transistor $Q_{1n}$ and $Q_{2n}$ of the n-th differential amplifier $E_n$ are connected to complementary output terminals $OUT_1$ and $OUT_2$.

As represented by equations (1) and (2), the amplification factor of each differential amplifier varies in proportion to the emitter current supplied to each differential amplifier, and therefore, the gain control is realized by controlling current values of the first to the n-th emitter currents $I_1$ to $I_n$ by the current controller 100 in the programmable-gain amplifier of FIG. 1.

Figure 2:
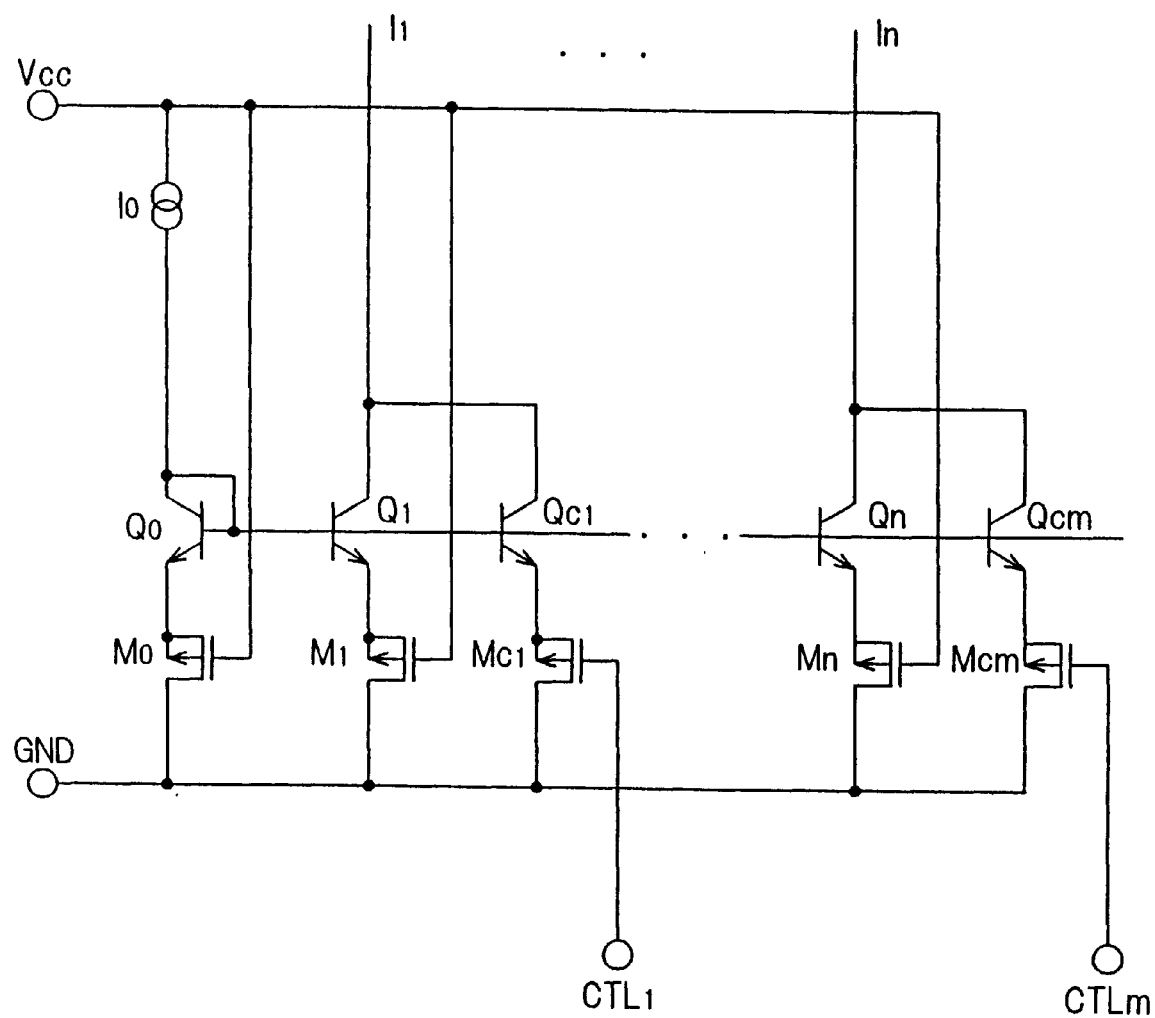
FIG. 2 is a partial circuit diagram illustrating a circuit configuration of the current controller 100 of FIG. 1.

FIG. 2 is a partial circuit diagram illustrating a circuit configuration of the current controller 100 of FIG. 1.

Referring to FIG. 2, the current controller 100 comprises an input bi-polar transistor $Q_0$, a first to an n-th output bi-polar transistor $Q_1$ to $Q_n$, and a first to an m-th control bi-polar transistor $Q_{c1}$ to $Q_{cm}$ (m being an integer more than one).

Each emitter of the bi-polar transistors $Q_0$ to $Q_n$ and $Q_{c1}$ to $Q_{cm}$ is connected to a ground GND through each of MOS transistors $M_0$ to $M_n$ and $M_{c1}$ to $M_{cm}$, respectively.

A constant current $I_0$ is supplied to a collector-base connection of the input bi-polar transistor $Q_0$.

Bases of the first to the n-th output bi-polar transistors $Q_1$ to $Q_n$ and the first to the m-th control bi-polar transistors $Q_{c1}$ to $Q_{cm}$ are connected to the base of the input bi-polar transistor $Q_0$.

Thus, each of the first to the n-th output bi-polar transistors $Q_1$ to $Q_n$ and the first to the m-th control bi-polar transistors $Q_{c1}$ to $Q_{cm}$ functions as an output transistor of a current mirror circuit through which a current flows which is proportional to the collector current of the input bi-polar transistor $Q_0$, when the respective MOS transistors $M_0$ to $M_n$ and $M_{c1}$ to $M_{cm}$ are controlled to be ON.

Each of the collectors of the first to the n-th output bi-polar transistors $Q_1$ to $Q_n$ is connected to a corresponding output terminal of the current controller 100 for outputting each of the first to the n-th emitter currents $I_1$ to $I_n$ to be supplied to each of the first to the n-th differential amplifiers $E_1$ and $E_n$. Certain ones of the output terminals are further connected to the collector(s) of one or more of the first to the m-th output control bi-polar transistors $Q_{c1}$ to $Q_{cm}$.

Gates of the MOS transistors $M_0$ to $M_n$ which are connected to the input transistors $Q_0$ and the first to the n-th output bi-polar transistors $Q_1$ to $Q_n$ are connected to the power supply Vcc, and each gate of the MOS transistors $M_{c1}$ to $M_{cm}$ is connected to a corresponding control terminal $CTL_1$ to $CTL_m$.

Therefore, by changing a logic level set of binary control signals to be supplied to the control terminals $CTL_{f1}$ to $CTL_m$, respective ones of the first to the n-th emitter currents $I_1$ to $I_n$, and consequently, a product of current values of the first to the n-th emitter currents $I_1$ to $I_n$ which defines the total gain of the programmable-gain amplifier of FIG. 1, can be controlled.

Figure 6:
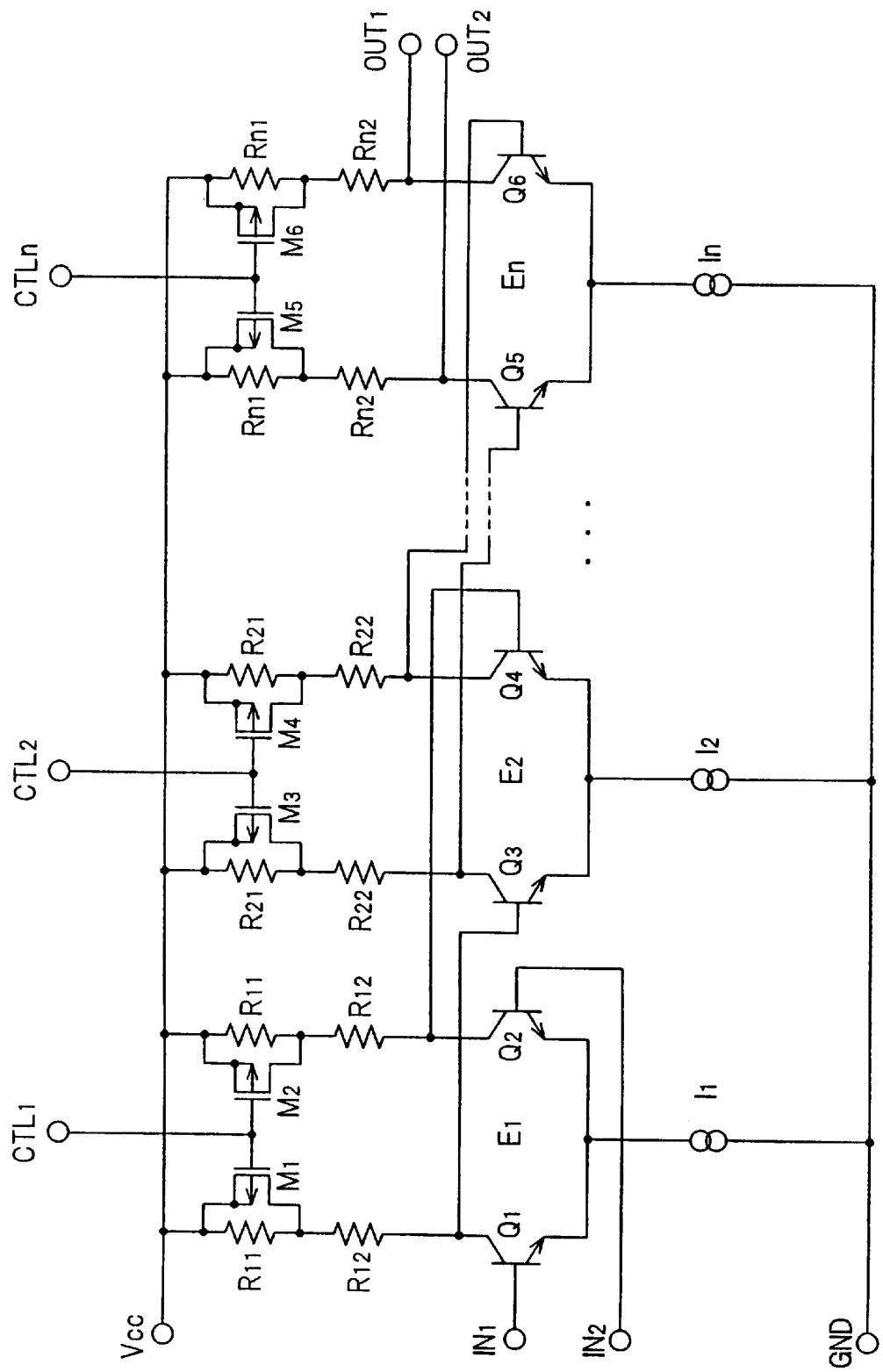
FIG. 6 is a circuit diagram illustrating a conventional example of the programmable-gain amplifier making use of the switching characteristics of MOS transistors and transfer characteristics of bi-polar transistors.

Furthermore, by designing the relative on-resistance of each of the MOS transistors $M_0$ to $M_n$ and $M_{c1}$ to $M_{cm}$ to be in inverse proportion to the relative emitter size of respective ones of the input, the output and the control bi-polar transistors $Q_0$ to $Q_n$ and $Q_{c1}$ to $Q_{cm}$, current values of the first the n-th emitter current $I_1$ to $I_n$ relative to the constant current $I_0$ can be controlled far more exactly than with the load resistance ratios of the conventional programmable-gain amplifier of FIG. 6, since the relative on-resistance of the MOS transistors are little affected by their fabrication process, even if the on-resistance itself, i.e., the absolute value, may be affected.

Still further, by thus designing the relative on-resistance of the MOS transistors, influences of variations of base-emitter voltage/collector-current characteristics of the bi-polar transistors can be reduced.

Therefore, by appropriately designing the relative emitters sizes of the input, the output and the control bi-polar transistors $Q_0$ to $Q_n$ and $Q_{c1}$ to $Q_{cm}$ together with the relative on-resistance of their respective MOS transistors $M_0$ to $M_n$ and $M_{c1}$ to $M_{cm}$, a programmable-gain amplifier in which the total gain can be controlled with $2^m$ steps can be realized with a desired fineness and sufficient exactness, according to the present invention.

Heretofore, one output terminal of the current controller 100 is described to correspond to one output bi-polar transistor, and one control bi-polar transistor is described to correspond to one binary control signal. However, any one of the output bi-polar transistors and the control bi-polar transistors may be replaced with more than one bi-polar transistor each paired with an appropriate MOS transistor for the convenience of obtaining a desired emitter size.

In the following paragraphs, a concrete example of the above embodiment will be described.

Figure 3:
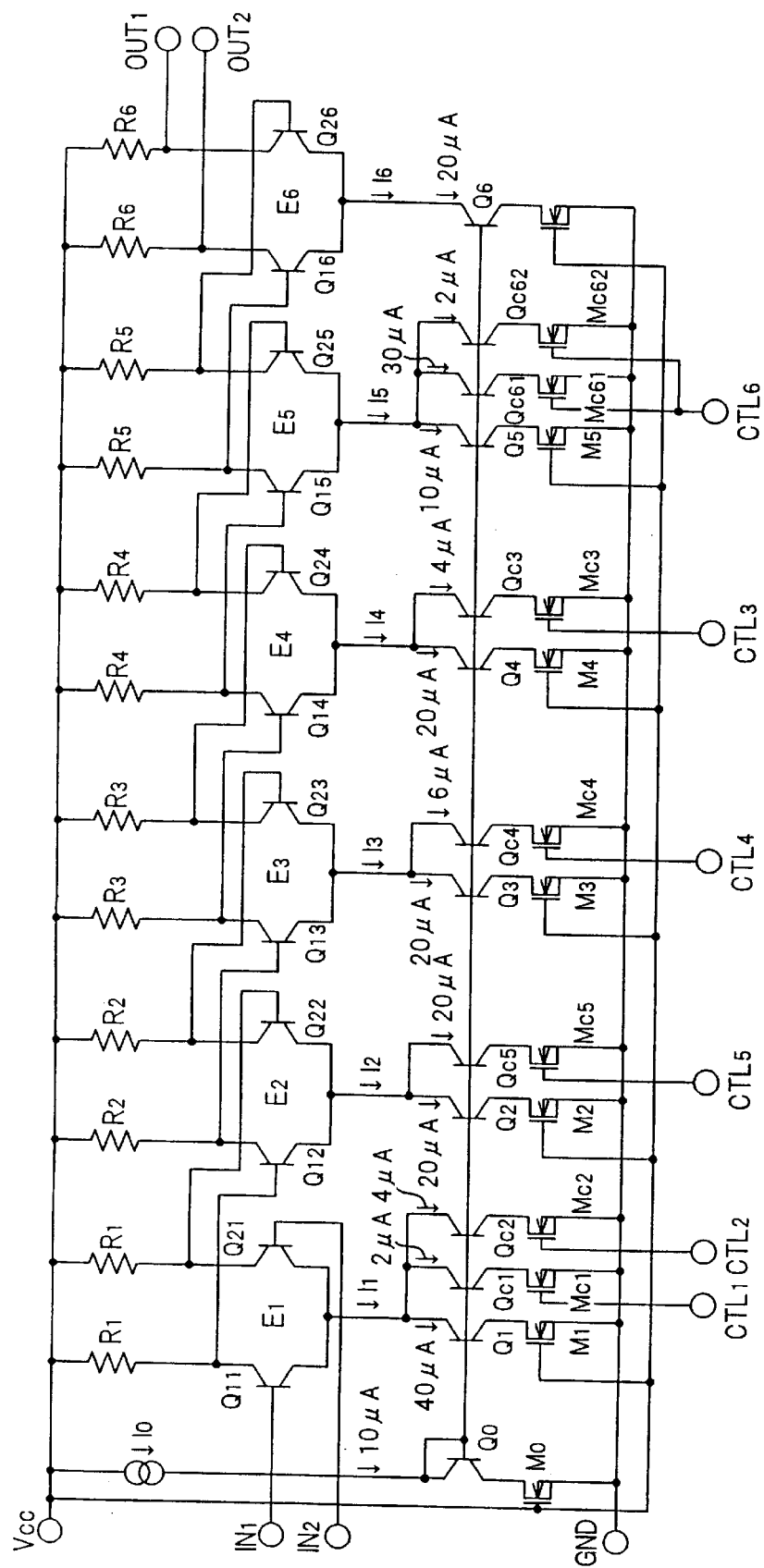
FIG. 3 is a circuit diagram illustrating a concrete example of a programmable-gain amplifier according to the embodiment of FIG. 1.

FIG. 3 is a circuit diagram illustrating the concrete example of a programmable-gain amplifier according to the embodiment of FIG. 1, wherein gain control in a width of about 24 dB (27.3 to 50. dB) of 64 quasi-linear steps is realized with linearity deviations between 0.94 to 1.17, with a simple circuit configuration making use of bi-polar transistors and MOS transistors each having a simple size/on-resistance ratio.

For realizing such control steps, emitter size ratios of the current controller 100 are arranged so that one of the first to the n-th emitter current $I_1$ to $I_n$ is approximately multiplied by an i-th member of a geometric series, that is, by $a^{2i-1}$ (a being a constant), when the i-th binary control signal supplied to the i-th control terminal $CTL_i$ is set to a logic level of HIGH.

Referring to FIG. 3, an input bi-polar transistor $Q_0$, a first to sixth output bi-polar transistor $Q_1$ to $Q_6$ and a first to sixth control bi-polar transistor $Q_{c1}$ to $Q_{c62}$ compose a current mirror circuit, each connected to a ground GND by way of respective MOS transistors $M_0$ to $M_6$ and $M_{c1}$ to $M_{c6}$, wherein gates of MOS transistors $M_0$ to $M_6$ are connected to a power supply Vcc, while gates of MOS transistors $M_{c1}$ to $M_{c6}$ are connected to respective control terminals $CTL_1$ to $CTL_6$, in the same way as described in connection with FIG. 2.

The emitter size ratio of each of the first to the sixth output bi-polar transistors $Q_1$ to $Q_6$, the first to the sixth control bi-polar transistors $Q_{c1}$ to $Q_{c62}$ and the on-resistance ratios thereof are designed as follows, relative to those of the input bi-polar transistor $Q_0$ and the on-resistance of the respective MOS transistor $M_0$, so as to generate the output currents listed below.

|   | Emitter size ratio | On-resistance ratio | Output current |
|---|---|---|---|
| $Q_0/M_0$ | 1 | 1 | 10 μA |
| $Q_1/M_1$ | 4 | 1/4 | 40 μA |
| $Q_{c1}/M_{c1}$ | 1/5 | 5 | 2 μA |
| $Q_{c2}/M_{c2}$ | 2/5 | 5/2 | 4 μA |
| $Q_2/M_2$ | 2 | 1/2 | 20 μA |
| $Q_{c5}/M_{c5}$ | 2 | 1/2 | 20 μA |
| $Q_3/M_3$ | 2 | 1/2 | 20 μA |
| $Q_{c4}/M_{c4}$ | 3/5 | 5/3 | 6 μA |
| $Q_4/M_4$ | 2 | 1/2 | 20 μA |
| $Q_{c3}/M_{c3}$ | 2/5 | 5/2 | 4 μA |
| $Q_5/M_5$ | 1 | 1 | 10 μA |
| $Q_{c61}/M_{c61}$ | 3 | 1/3 | 30 μA |
| $Q_{c62}/M_{c62}$ | 1/5 | 5 | 2 μA |
| $Q_6/M_6$ | 2 | 1/2 | 20 μA |

Therefore, the product of the first to the sixth emitter currents which defines the total gain of the programmable-gain amplifier of FIG. 3 is multiplied as shown below, by turning the binary control signal supplied to each of the control terminals $CTL_1$ to $CTL_6$, respectively.

$CTL_1$:×42/40

$CTL_2$:×44/40

$CTL_3$:×24/20

$CTL_4$:×26/20

$CTL_5$:×40/20

$CTL_6$:×42/10

So, by changing the logic levels of the binary control signals from {Low, Low, Low, Low, Low, Low} to {High, High, High, High, High, High}, the total gain of the programmable-gain amplifier of FIG. 1 can be controlled with 64 quasi-linear (in dB) steps, as shown in FIG. 4.

FIG. 4 is a table chart illustrating a portion of the relative gains obtained according to the logic levels of the binary control signals from a programmable-gain amplifier fabricated according to the circuit of FIG. 3, and FIG. 5 is a graphical chart representing a linear increase of the gain obtained according to the control steps.

As shown in FIGS. 4 and 5, gain control of sufficiently fine steps is realized with sufficiently exact linearity with a simple circuit configuration according to the embodiment.

What is claimed is:

1. A programmable-gain amplifier, comprising:

a cascade connection of a plurality of differential amplifiers, each having a pair of bi-polar transistors having emitters which are commonly connected; and a current controller having output terminals for outputting emitter currents each supplied to the commonly connected emitters of the pair of bi-polar transistors of each of the differential amplifiers, a product of the emitter currents being controlled according to logic levels of a set of binary control signals supplied to the current controller; said current controller having a current mirror circuit comprising:

an input bi-polar transistor having an emitter which is connected to a ground through an input MOS (Metal Oxide Semiconductor) transistor controlled to be ON, wherein a constant current is supplied through the input bi-polar transistor;

output bi-polar transistors, each of the output bi-polar transistors having a collector connected to a corresponding one of the output terminals of the current controller, a base connected to a base of the input bi-polar transistor, and an emitter connected to the ground through a respective MOS transistor controlled to be ON, wherein a relative on-resistance of each of said respective MOS transistors to the input MOS transistor is designed to be in inverse proportion to a relative emitter size of said each of the output bi-polar transistors to the input bi-polar transistor; and control bi-polar transistors, each of the control bi-polar transistors having a collector connected to a corresponding one of the output terminals of the current controller, a base connected to a base of the input bi-polar transistor, and an emitter connected to the ground through a respective control MOS transistor, wherein a relative on-resistance of each of said respective control MOS transistors to the input MOS transistor is designed to be in inverse proportion to a relative emitter size of said each of the control bi-polar transistors to the input bi-polar transistor, and wherein each of said control MOS transistors is switched according to the logic level of one of the binary control signals.

2. A programmable-gain amplifier as recited in claim 1, wherein each of certain ones of the emitter currents is multiplied by a different ratio according to the logic level of the corresponding binary control signal.

3. A programmable-gain amplifier as recited in claim 2, wherein one of the emitter currents is approximately multiplied by a $2^{i-1}$-th member of a geometric series when an i-th one of the binary control signals is turned to a HIGH logic level, i being a positive integer.

* * * * *